United States Patent
Hou et al.

(10) Patent No.: US 9,269,434 B2
(45) Date of Patent: Feb. 23, 2016

(54) RESISTIVE MEMORY APPARATUS AND WRITE-IN METHOD THEREOF

(71) Applicant: Winbond Electronics Corp., Taichung (TW)

(72) Inventors: Tuo-Hung Hou, Hsinchu (TW); Chung-Wei Hsu, Taitung County (TW); Mei-Chin Chen, Pingtung County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/203,585

(22) Filed: Mar. 11, 2014

(65) Prior Publication Data
US 2015/0146473 A1   May 28, 2015

(30) Foreign Application Priority Data
Nov. 26, 2013   (TW) .............................. 102143042 A (51) Int. Cl.
*G11C 13/02* (2006.01)
*G11C 13/00* (2006.01)
*H01L 45/00* (2006.01)

(52) U.S. Cl.
CPC ........ *G11C 13/0069* (2013.01); *G11C 13/0002* (2013.01); *G11C 13/0004* (2013.01); *G11C 13/0023* (2013.01); *G11C 13/0097* (2013.01); *H01L 45/00* (2013.01); *G11C 2213/71* (2013.01); *G11C 2213/77* (2013.01)

(58) Field of Classification Search
CPC ........... G11C 13/0004; G11C 13/0069; G11C 13/0073; G11C 13/009; G11C 13/0097
USPC .................................. 365/148, 158, 163, 173
See application file for complete search history.

(56) References Cited

U.S. PATENT DOCUMENTS

| | | | |
|---|---|---|---|
| 6,411,548 B1 * | 6/2002 | Sakui et al. .............. | 365/185.17 |
| 8,335,100 B2 | 12/2012 | Liu et al. | |
| 2005/0041467 A1 * | 2/2005 | Chen ............................ | 365/184 |

(Continued)

OTHER PUBLICATIONS

Chung-Wei Hsu, et al., "3D Vertical TaOx / TiO2 RRAM with over 103 Self-Rectifying Ration and Sub-uA Operating Current," IEDM (International Electron Devices Meeting), Dec. 2013, pp. 1-4.

(Continued)

*Primary Examiner* — Huan Hoang
*Assistant Examiner* — Jay Radke
(74) *Attorney, Agent, or Firm* — Jianq Chyun IP Office (57) ABSTRACT

A resistive memory apparatus and a write-in method thereof are provided. The memory controller provides unselected bit-lines and unselected word-lines both not coupled to a selected resistive memory cell respectively with a first bit-line voltage and a first word-line voltage in one of a setting duration and a resetting duration, wherein the first bit-line voltage is equal to a product of a writing-in voltage $V_W$ and $(n-1)/n$ and the first word-line voltage is equal to $V_W \times 1/n$. The memory controller provides the unselected bit-lines not coupled to the selected resistive memory cell with a second bit-line voltage and the unselected word-lines not coupled to the selected resistive memory cell with a second word-line voltage in the other one of the setting duration and the resetting duration, wherein the second bit-line voltage is equal to $V_W \times 1/n$ and the second word-line voltage is equal to $V_W \times (n-1)/n$.

7 Claims, 6 Drawing Sheets (56) References Cited

U.S. PATENT DOCUMENTS

2006/0056225 A1\*　3/2006　Hashimoto et al. ........... 365/145
2008/0273363 A1　11/2008　Mouli
2008/0304307 A1\*　12/2008　Gopalakrishnan .............. 365/51
2011/0188281 A1\*　8/2011　Siau et al. ....................... 365/51

OTHER PUBLICATIONS

"Office Action of Taiwan Counterpart Application", issued on Jun. 29, 2015, p. 1-p. 5, in which the listed references were cited.

\* cited by examiner

RESISTIVE MEMORY APPARATUS AND WRITE-IN METHOD THEREOF

CROSS-REFERENCE TO RELATED APPLICATION

This application claims the priority benefit of Taiwan application serial no. 102143042, filed on Nov. 26, 2013. The entirety of the above-mentioned patent application is hereby incorporated by reference herein and made a part of this specification.

BACKGROUND OF THE INVENTION

1. Field of the Invention

The present invention generally relates to a resistive memory apparatus and a write-in method thereof, and more particularly, to a cross-bar resistive memory apparatus and write-in method thereof.

2. Description of Related Art

Based on the demand for next-generation non-volatile memory, a kind of resistive memory have been developed. This resistive random memory access can be random accessed, and be used to replace the NAND flash memory. In order to increase the density of memory, a high-density three-dimensional vertically arranged resistive memory apparatus is also been proposed.

In a cross-bar resistive memory apparatus, the most concerned issue is that, as performing a data-writing operation on the memory cells of the cross-bar resistive memory apparatus, the unselected memory cells arranged in the same memory columns and the same memory rows as ones of the selected memory cells would produce voltage differences due to the voltages delivered on the bit-lines and the word-lines, which causes the resistance thereof adjusted into a region to be reset and triggers data-storing error.

The aforementioned situation becomes particularly serious for the resistive memory apparatus with asymmetric memory characteristic. In such a resistive memory apparatus, the relation between current and voltage in the resetting state of the memory cell is asymmetric with the relation between current and voltage in the setting state of the memory cell thereof. Thus, any solution in the prior art to reset and set the resistive memory cells with asymmetric characteristic by using a same voltage is apparently not appropriate.

SUMMARY OF THE INVENTION

Accordingly, the present invention is directed to a resistive memory apparatus and a write-in method thereof, which are able to effectively prevent its resistive memory cells from write-in errors and effectively maintain the data correctness.

A resistive memory apparatus of the invention includes a memory cell array and a memory controller. The memory cell array includes a plurality of memory unit, in which each of the memory units includes a plurality of stacked resistive memory cells, the resistive memory cells are respectively coupled to a plurality of word-lines and the memory units are respectively coupled to a plurality of bit-lines. The memory controller is coupled to the memory cell array, wherein the memory controller provides a plurality of unselected bit-lines not coupled to a selected resistive memory cell with a first bit-line voltage and a plurality of unselected word-lines not coupled to the selected resistive memory cell with a first word-line voltage in one of a setting duration and a resetting duration, in which the first bit-line voltage is equal to a product of a writing-in voltage $V_W$ and $(n-1)/n$ and the first word-line voltage is equal to $V_W \times 1/n$ wherein n is a real number greater than 3. The memory controller provides the unselected bit-lines not coupled to the selected resistive memory cell with a second bit-line voltage and the unselected word-lines not coupled to the selected resistive memory cell with a second word-line voltage in the other one of the setting duration and the resetting duration, wherein the second bit-line voltage is equal to $V_W \times 1/n$ and the second word-line voltage is equal to $V_W \times (n-1)/n$.

A write-in method of resistive memory apparatus in the invention includes following steps: providing a plurality of unselected bit-lines not coupled to a selected resistive memory cell with a first bit-line voltage and a plurality of unselected word-lines not coupled to the selected resistive memory cell with a first word-line voltage in a setting duration, wherein the first bit-line voltage is equal to a product of a writing-in voltage $V_W$ and $(n-1)/n$ and the first word-line voltage is equal to $V_W \times 1/n$ wherein n is a real number greater than 3; and providing the unselected bit-lines not coupled to the selected resistive memory cell with a second bit-line voltage and the unselected word-lines not coupled to the selected resistive memory cell with a second word-line voltage in the resetting duration, wherein the second bit-line voltage is equal to $V_W \times 1/n$ and the second word-line voltage is equal to $V_W \times (n-1)/n$.

Based on the depiction above, in the invention, through setting and resetting the resistive memory cells and providing different word-line voltages and bit-line voltages, the resistance of the unselected resistive memory cells are not affected by the received word-line voltages and bit-line voltages to change the previously-stored data so as to maintain the data correctness.

In order to make the features and advantages of the present invention more comprehensible, the present invention is further described in detail in the following with reference to the embodiments and the accompanying drawings.

DESCRIPTION OF THE EMBODIMENTS

Figure 1A:
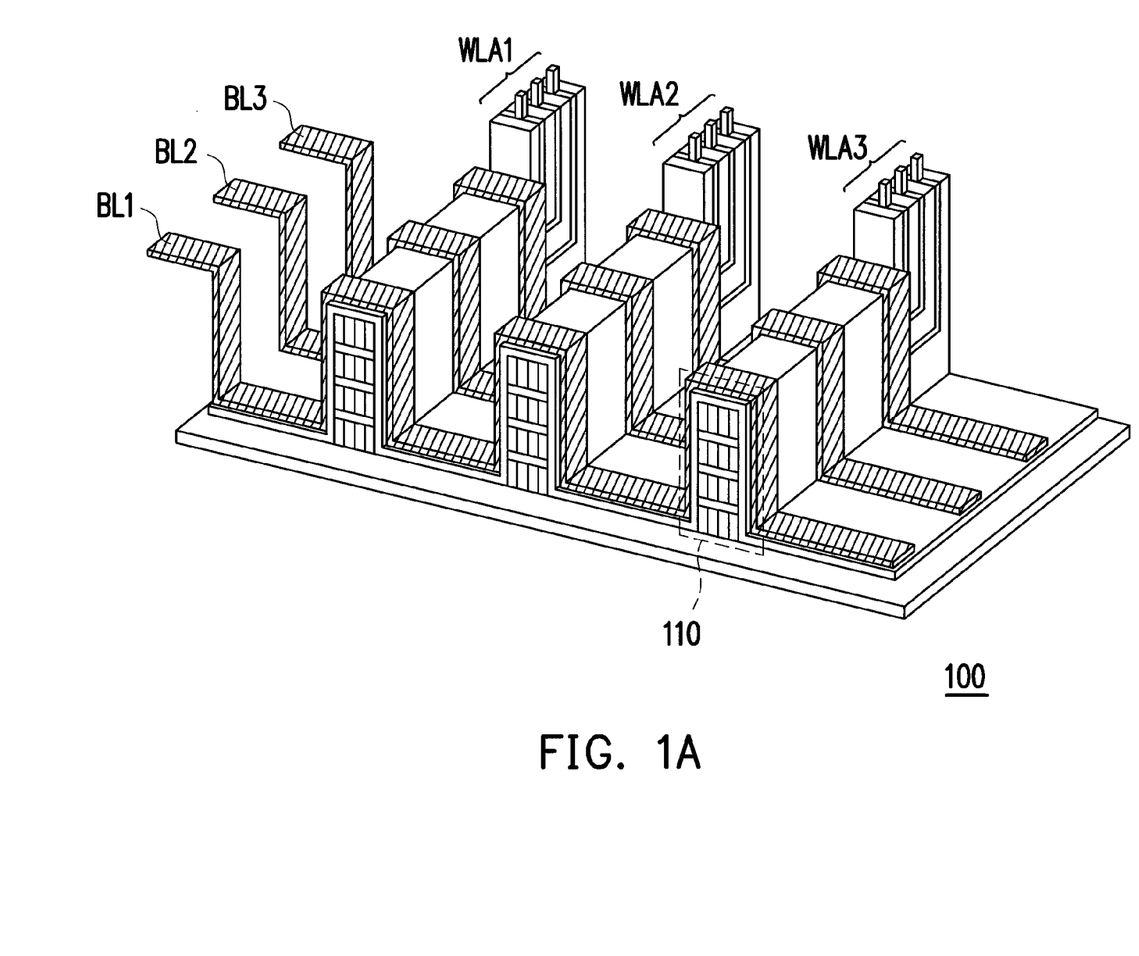
FIG. 1A is a structure diagram of a resistive memory cell array according to an embodiment of the present invention.

FIG. 1A is a structure diagram of a resistive memory cell array according to an embodiment of the present invention. Referring to FIG. 1A, a memory cell array 100 includes a plurality of memory units in pillared structure 110, wherein the memory units are arranged in array and respectively coupled to a plurality of bit-lines BL1-BL3. The memory units 110 are also respectively coupled to a plurality of word-line sets WLA1-WLA3. In FIG. 1, each of the word-line sets WLA1-WLA3 includes three word-lines. Taking one of the memory units 110 with mark "110" as an example, the memory unit 110 is coupled to the word-line set WLA3 having three word-lines WL1-WL3.

Figure 1B:
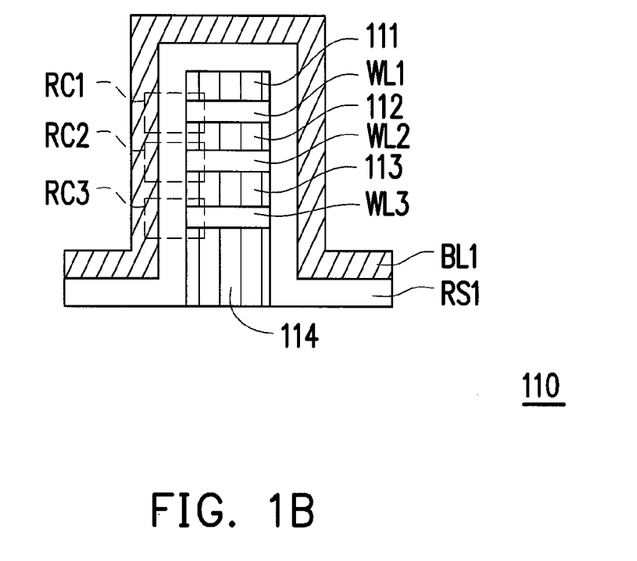
FIG. 1B is an enlarged diagram of a memory unit in an embodiment of the invention.

Referring to FIGS. 1A and 1B, FIG. 1B is an enlarged diagram of a memory unit 110 in an embodiment of the invention. In FIG. 1B, a plurality of insulation layers 111-114 are cross-stacked between the conductive layers respectively serving as the word-lines WL1-WL3. A resistive layer RS1 overlays the insulation layers 111-114 and the word-lines WL1-WL3, and the bit-line BL1 overlays the resistive layer RS1. In FIG. 1B, the regions between the bit-line BL1 and the word-lines WL1-WL3 respectively form three resistive memory cells RC1, RC2 and RC3.

Figure 2:
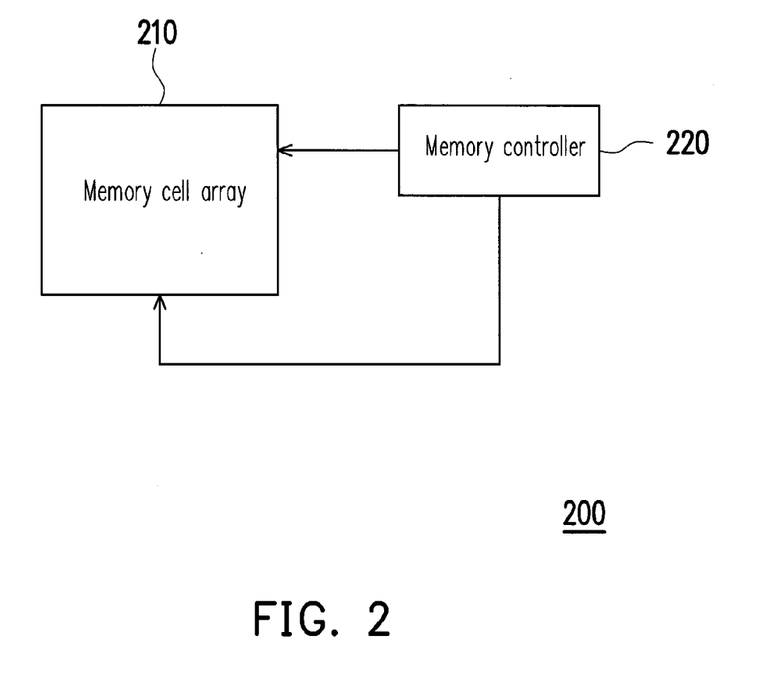
FIG. 2 is a schematic diagram of a resistive memory apparatus according to an embodiment of the present invention.

FIG. 2 is a schematic diagram of a resistive memory apparatus according to an embodiment of the present invention. Referring to FIG. 2, a resistive memory apparatus 200 includes a memory cell array 210 and a memory controller 220. The memory cell array 210 can be a memory cell array 110 shown by FIG. 1A, and the memory controller 220 is coupled to the memory cell array 210 for providing the memory cell array 210 with bit-line voltages and word-line voltages.

In the embodiment, the memory controller 220 can provide the word-line voltage to the word-lines in the memory cell array 210 and deliver the bit-line voltages through the bit-lines in the memory cell array 210 or receive the read out data through the bit-lines in the memory cell array 210. It should be noted that for writing data on the resistive memory cells in the memory cell array 210, there are a resetting way and a setting way on the resistance of the resistive memory cells.

Figure 3A:
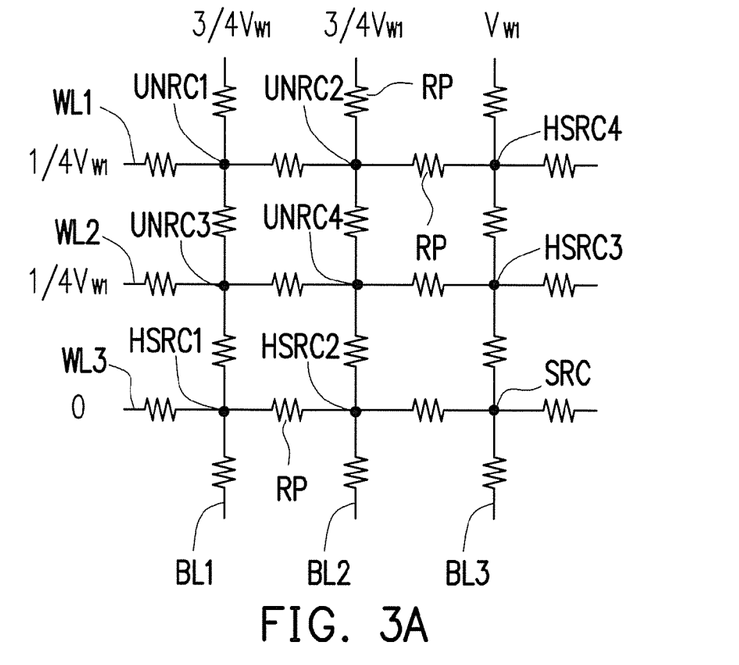
FIG. 3A is a diagram illustrating a setting way on resistive memory cells in an embodiment of the invention.

FIG. 3A is a diagram illustrating a setting way on resistive memory cells in an embodiment of the invention. Taking a array of 3×3 memory cells as a preferred example in FIG. 3A, referring to FIGS. 2 and 3A, as conducting setting resistance on the selected memory cell SRC, the memory controller 220 can provides a selected word-line WL3 coupled to a selected resistive memory cell SRC with a reference grounding voltage of, for example, 0V and provide a selected bit-line BL3 coupled to the selected memory cell SRC with a first writing-in voltage $V_{W1}$ in a setting duration. In addition, the memory controller 220 provides the unselected word-lines WL1 and WL2 with a word-line voltage equal to ¼ first writing-in voltage $V_{W1}$ and provides the unselected bit-lines BL1 and BL2 with a bit-line voltage equal to ¾ first writing-in voltage $V_{W1}$. The unselected bit-lines BL1 and BL2 and the unselected word-lines WL1 and WL2 are not coupled to the memory cell SRC.

It should be noted that there are many wire resistors RP formed on the word-lines WL1 and WL2 and the bit-lines BL1 and BL2. With the structure of a cross-bar resistive memory, these wire resistors RP are distributed between the resistive memory cells.

Figure 4:
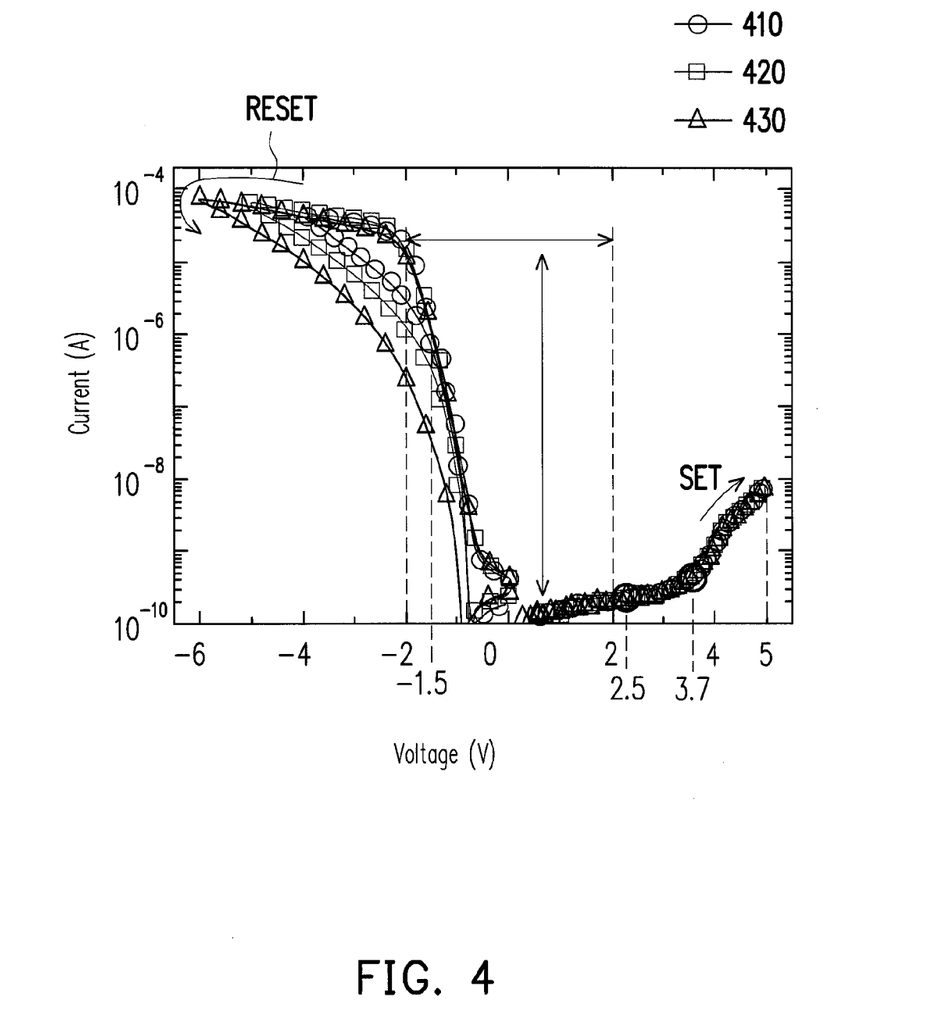
FIG. 4 is a graphical chart showing a relation between current and voltage in an embodiment of the invention.

Meanwhile referring to FIG. 4, FIG. 4 is a graphical chart showing a relation between current and voltage in an embodiment of the invention, wherein curves 410-430 respectively show the relation between current and voltage required by the resistive memory cell corresponding to three resetting voltages of −4V, −5V and −6V. Arrow mark RESET and arrow mark SET represent respectively three relation trends between current and voltage for the resistive memory cell to be set and reset. As shown by FIG. 4, these two kinds of relations between current and voltage respectively for the resetting state and the setting state of the resistive memory cell are not symmetric with each other.

Under the aforementioned condition in association with the graphical charts of FIG. 4, the voltage difference between the bit-line and the word-line withstood by the unselected resistive memory cells UNRC1-UNRC4 is equal to ½ first writing-in voltage $V_{W1}$. Taking the writing-in voltage of around 5V as an example wherein the writing-in voltage is demanded by setting the resistive memory cell, ½ first writing-in voltage $V_{W1}$ is roughly equal to 2.5V which does not fall in the effectively set region. Therefore, the resistance of the unselected resistive memory cells UNRC1-UNRC4 would not be set. On the contrary, the voltage difference between the selected bit-line BL3 and the selected word-line WL3 withstood by the selected resistive memory cell SRC is equal to the first writing-in voltage $V_{W1}$ so as to effectively set the resistance thereof.

It should be noted that among a plurality of unselected resistive memory cells HSRC1-HSRC4 connected to one of the selected word-line WL3 and the selected bit-line BL3, taking the unselected resistive memory cell HSRC4 as an example, the unselected resistive memory cell HSRC4 receives a bit-line voltage equal to the first writing-in voltage $V_{W1}$ through the selected bit-line BL3 and receives a word-line voltage equal to the ¼ first writing-in voltage $V_{W1}$ through the unselected word-line WL1. In this way, the voltage difference between the bit-line and the word-line coupled to the resistive memory cell HSRC4 is equal to the ¾ first writing-in voltage $V_{W1}$, i.e., 3.75V. It can be seen from FIG. 4 that the resistance of the unselected resistive memory cell HSRC1 would not be set. For the rest unselected resistive memory cells HSRC1-HSRC3, similarly to the unselected resistive memory cell HSRC4, the resistance thereof would not be set as well so as to avoid data-writing error.

Figure 3B:
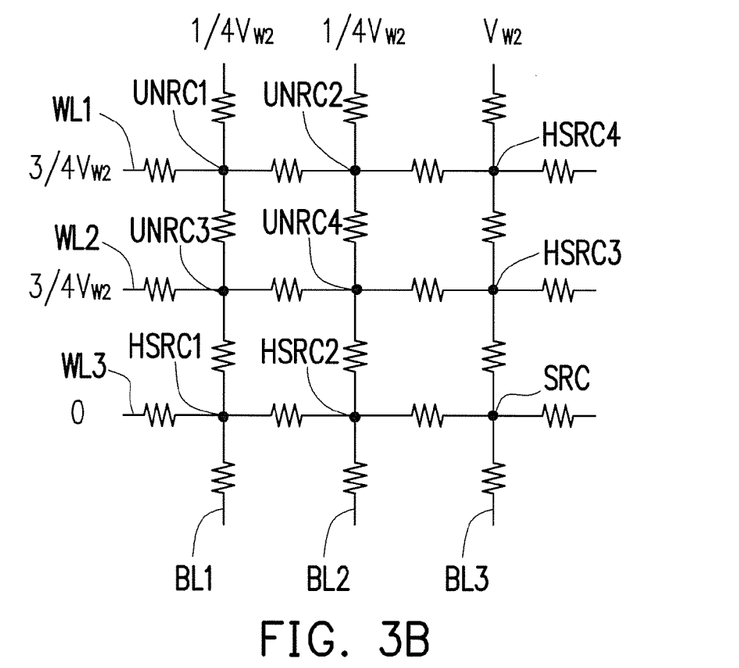
FIG. 3B is a diagram illustrating a resetting way on resistive memory cells in an embodiment of the invention.

FIG. 3B is a diagram illustrating a resetting way on resistive memory cells in an embodiment of the invention. Referring to FIGS. 2 and 3B, taking a array of 3×3 memory cells as a preferred example in FIG. 3B, as conducting resetting resistance on the selected memory cell SRC, the memory controller 220 can provides the selected word-line WL3 coupled to the selected resistive memory cell SRC with a reference grounding voltage of 0V and provide the selected bit-line BL3 coupled to the selected memory cell SRC with a second writing-in voltage $V_{W2}$ in a resetting duration. In addition, the memory controller 220 provides the unselected word-lines WL1 and WL2 with a word-line voltage equal to ¾ second writing-in voltage $V_{W2}$ and provides the unselected bit-lines BL1 and BL2 with a bit-line voltage equal to ¼ second writing-in voltage $V_{W2}$.

In association with the graphical charts of FIG. 4, the voltage difference between the bit-line and the word-line withstood by the unselected resistive memory cells UNRC1-UNRC4 is equal to ¼ second writing-in voltage $V_{W2}$. Taking the writing-in voltage of around −6V as an example wherein the ¼ second writing-in voltage $V_{W2}$ is equal to −1.5V which does not fall in the effectively set region. Therefore, the resistance of the unselected resistive memory cells UNRC1-UNRC4 would not be set. On the contrary, the voltage difference between the selected bit-line BL3 and the selected word-line WL3 withstood by the selected resistive memory cell SRC is equal to a negative second writing-in voltage $V_{W2}$ (−6V) so as to effectively reset the resistance thereof.

It should be noted that among the unselected resistive memory cells HSRC1-HSRC4 connected to one of the selected word-line WL3 and the selected bit-line BL3, taking the unselected resistive memory cell HSRC4 as an example, the unselected resistive memory cell HSRC4 receives the bit-line voltage equal to the second writing-in voltage $V_{W2}$ through the selected bit-line BL3 and receives a word-line voltage equal to the ¾ second writing-in voltage $V_{W2}$ through the unselected word-line WL1. In this way, the voltage difference between the bit-line and the word-line coupled to the resistive memory cell HSRC4 is equal to the ¼ second writing-in voltage $V_{W2}$, i.e., 1.5V or so. It can be seen from FIG. 4 that the resistance of the unselected resistive memory cell HSRC4 would not be reset. For the rest unselected resistive memory cells HSRC1-HSRC3, similarly to the unselected resistive memory cell HSRC4, the resistance thereof would not be reset as well so as to avoid data-writing error.

Additionally, as resetting and setting the resistance of the resistive memory cell in the embodiment of the invention, the voltages provided to both the unselected bit-line and the unselected word-line not coupled to the selected resistive memory can be switched by each other. For example, as resetting the resistance of the selected resistance of the resistive memory cell SRC, the unselected word-lines WL1 and WL2 can be provided with the word-line voltage equal to ¼ second writing-in voltage $V_{W2}$ and the unselected bit-lines BL1 and BL2 with the bit-line voltage equal to ¾ second writing-in voltage $V_{W2}$; as setting the resistance of the selected resistance of the resistive memory cell SRC, the unselected word-lines WL1 and WL2 can be provided with the word-line voltage equal to ¾ first writing-in voltage $V_{W1}$ and the unselected bit-lines BL1 and BL2 with the bit-line voltage equal to ¼ first writing-in voltage $V_{W1}$.

Figure 5A:
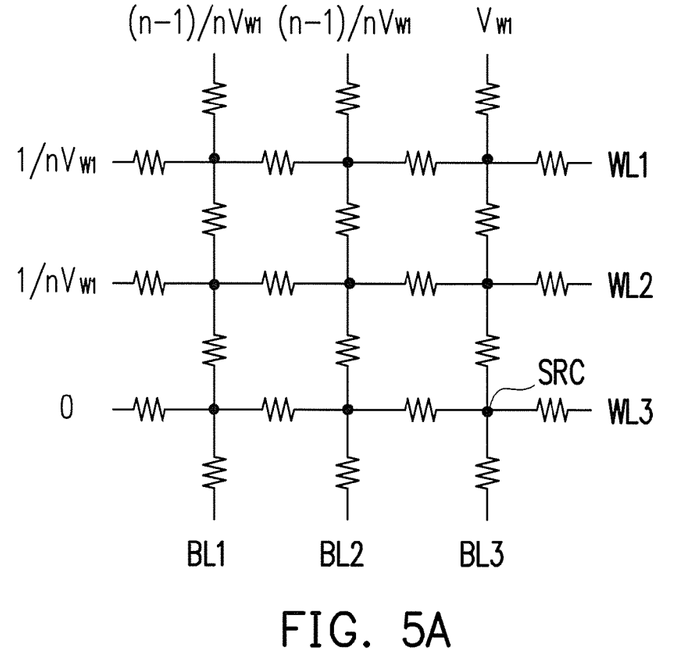
FIGS. 5A and 5B are diagrams illustrating another implementation respectively for setting and resetting the resistive memory cells in an embodiment of the invention.
Figure 5B:
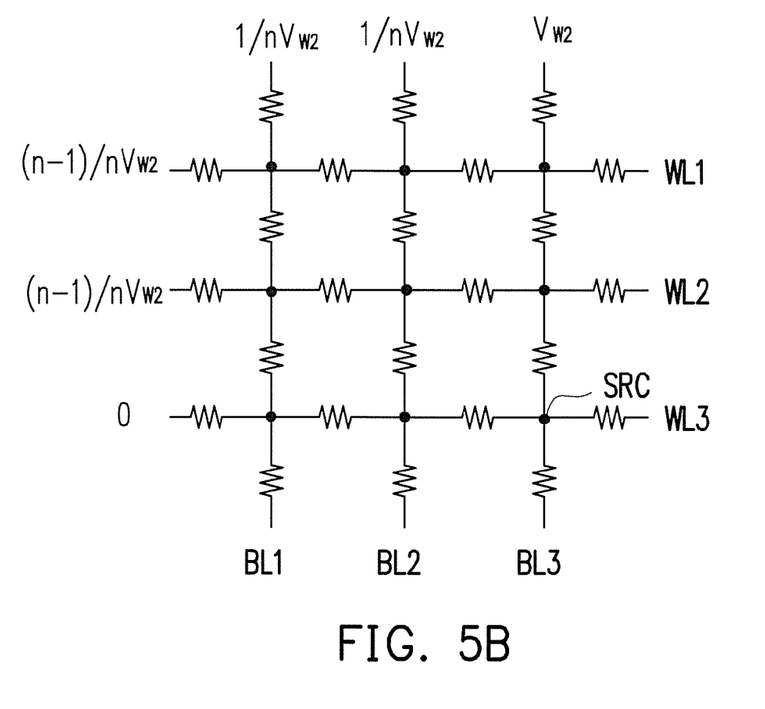

FIGS. 5A and 5B are diagrams illustrating another implementation respectively for setting and resetting the resistive memory cells in an embodiment of the invention. Referring to FIGS. 5A and 5B, as conducting setting resistance on the selected memory cell SRC in FIG. 5A, the selected word-line WL3 coupled to the selected resistive memory cell SRC is provided with a reference grounding voltage of 0V and the selected bit-line BL3 coupled to the selected memory cell SRC with a first writing-in voltage $V_{W1}$ in a setting duration. Meanwhile, the unselected word-lines WL1 and WL2 not coupled to the selected memory cell SRC is provided with a word-line voltage equal to 1/n first writing-in voltage $V_{W1}$ and the unselected bit-lines BL1 and BL2 not coupled to the selected memory cell SRC are provided with a bit-line voltage equal to (n−1)/n first writing-in voltage $V_{W1}$ wherein n is a real number greater than 3, so that the rest unselected resistive memory cells except to the selected memory cell SRC can be inhibited.

In FIG. 5B, as conducting resetting resistance on the memory cell, the selected word-line WL3 coupled to the selected resistive memory cell SRC is provided with a reference grounding voltage of 0V and the selected bit-line BL3 coupled to the selected memory cell SRC with a second writing-in voltage $V_{W2}$ in a resetting duration. Meanwhile, the unselected word-lines WL1 and WL2 not coupled to the selected memory cell SRC is provided with a word-line voltage equal to (n−1)/n second writing-in voltage $V_{W2}$ and the unselected bit-lines BL1 and BL2 not coupled to the selected memory cell SRC are provided with a bit-line voltage equal to 1/n second writing-in voltage $V_{W2}$, so that the rest unselected resistive memory cells except to the selected memory cell SRC can be inhibited The aforementioned situation of FIG. 5A can be used for resetting action on the resistive memory cell, while the aforementioned situation of FIG. 5B can be used for setting action on the resistive memory cell.

It should be noted that the array composed of 3×3 resistive memory cells in the aforementioned embodiments are examples only, which does not limit the scope of the invention. In fact, any-dimension array of resistive memory cells can use the disclosed approach of the invention herein for writing actions.

Figure 6:
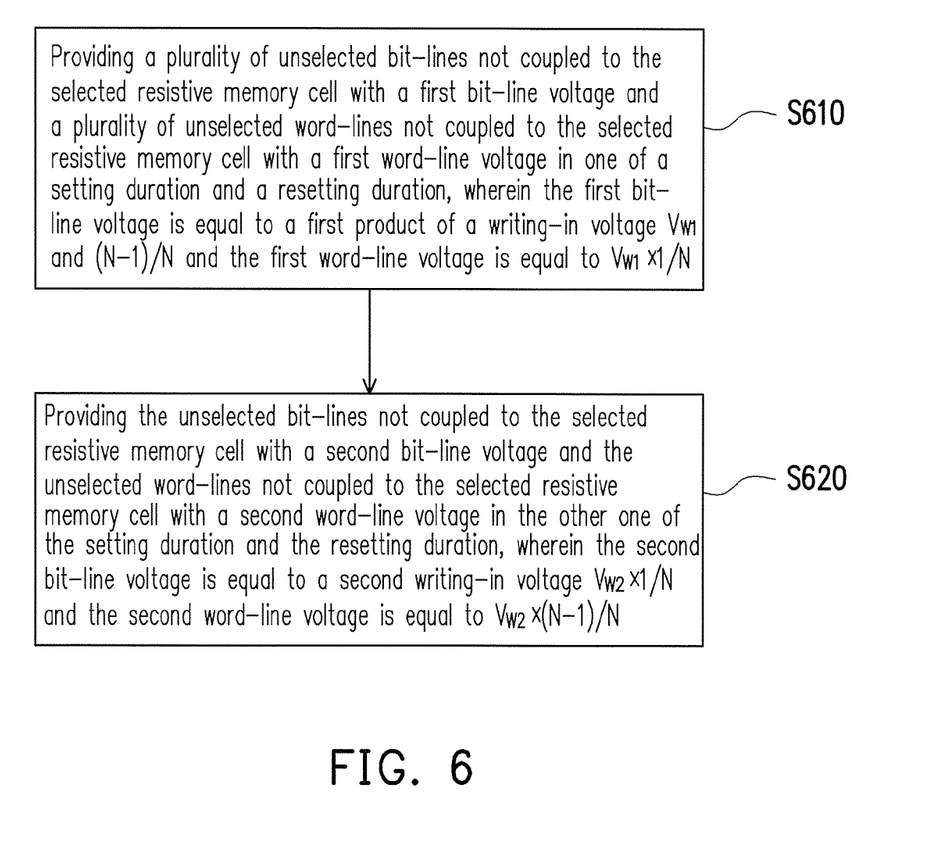
FIG. 6 is a flowchart of a write-in method of resistive memory in an embodiment of the invention.

FIG. 6 is a flowchart of a write-in method of resistive memory in an embodiment of the invention. Referring to FIG. 6, in step S610, it is provided that a plurality of unselected bit-lines not coupled to the selected resistive memory cell with a first bit-line voltage and a plurality of unselected word-lines not coupled to the selected resistive memory cell with a first word-line voltage in one of a setting duration and a resetting duration, wherein the first bit-line voltage is equal to a product of a first writing-in voltage $V_{W1}$ and (n−1)/n and the first word-line voltage is equal to $V_{W1} \times 1/n$ wherein n is a real number greater than 3. In step S620, it is provided that the unselected bit-lines not coupled to the selected resistive memory cell with a second bit-line voltage and the unselected word-lines not coupled to the selected resistive memory cell with a second word-line voltage in the other one of the setting duration and the resetting duration, wherein the second bit-line voltage is equal to a product of a second writing-in voltage $V_{W2}$ and 1/n and the second word-line voltage is equal to $V_{W2} \times (n-1)/n$.

The implementation details of the aforementioned steps can refer the above-described embodiments of the invention so as to be omitted to describe.

In summary, in the invention, through resetting and setting the resistive memory cells and providing different word-line voltages and bit-line voltages, the resistance of the selected resistive memory cells can be set or reset, and the unselected resistive memory cells can be inhibited without being set or reset. In this way, data can be effectively and correctly written into the resistive memory cells. In addition, when no updating is needed, the previously stored data are not re-written due to the writing actions on other resistive memory cells so as to maintain the data correctness.

What is claimed is:

1. A resistive memory apparatus, comprising:
   a memory cell array, comprising a plurality of memory unit, wherein each of the memory units comprises a plurality of stacked resistive memory cells, the resistive memory cells are respectively coupled to a plurality of word-lines and the memory units are respectively coupled to a plurality of bit-lines; and
   a memory controller, coupled to the memory cell array, wherein, the memory controller provides a plurality of unselected bit-lines not coupled to a selected resistive memory cell with a first bit-line voltage and a plurality of unselected word-lines not coupled to the selected resistive memory cell with a first word-line voltage in one of a setting duration and a resetting duration, wherein the first bit-line voltage is equal to a product of a first writing-in voltage $V_{W1}$ and (n−1)/n, and the first word-line voltage is equal to $V_{W1} \times 1/n$, wherein n is a real number greater than 3,
   the memory controller provides the unselected bit-lines not coupled to the selected resistive memory cell with a second bit-line voltage and the unselected word-lines not coupled to the selected resistive memory cell with a second word-line voltage in the other one of the setting duration and the resetting duration, wherein the second bit-line voltage is equal to a product of a second writing-in voltage $V_{W2}$ and 1/n, and the second word-line voltage is equal to $V_{W2} \times (n-1)/n$.

2. The resistive memory apparatus as claimed in claim 1, wherein the memory controller provides a selected word-line coupled to the selected resistive memory cell with a reference grounding voltage and a selected bit-line coupled to the selected resistive memory cell with the first and second writing-in voltages in the setting duration and the resetting duration.

3. The resistive memory apparatus as claimed in claim 1, wherein characteristic relation between current and voltage for a resetting state of each the resistive memory cell and characteristic relation between current and voltage for a setting state of each the resistive memory cell are not symmetric with each other.

4. The resistive memory apparatus as claimed in claim 1, wherein the memory units are arranged in array.

5. A write-in method of resistive memory, comprising:
providing a plurality of unselected bit-lines not coupled to a selected resistive memory cell with a first bit-line voltage and a plurality of unselected word-lines not coupled to the selected resistive memory cell with a first word-line voltage in one of a setting duration and a resetting duration, wherein the first bit-line voltage is equal to a product of a first writing-in voltage $V_{W1}$ and $(n-1)/n$, and the first word-line voltage is equal to $V_{W1} \times 1/n$, wherein n is a real number greater than 3; and
providing the unselected bit-lines not coupled to the selected resistive memory cell with a second bit-line voltage and the unselected word-lines not coupled to the selected resistive memory cell with a second word-line voltage in the other one of the setting duration and the resetting duration, wherein the second bit-line voltage is equal to a product of a second writing-in voltage $V_{W2} \times 1/n$ and the second word-line voltage is equal to $V_{W2} \times (n-1)/n$.

6. The write-in method of resistive memory as claimed in claim 5, further comprising:
providing a selected word-line coupled to the selected resistive memory cell with a reference grounding voltage and a selected bit-line coupled to the selected resistive memory cell with the first and second writing-in voltages in the setting duration and the resetting duration.

7. The write-in method of resistive memory as claimed in claim 5, wherein the resistive memory comprises a plurality of resistive memory cells, and characteristic relation between current and voltage for a resetting state of each the resistive memory cell and characteristic relation between current and voltage for a setting state of each the resistive memory cell are not symmetric with each other.

\* \* \* \* \*